United States Patent
Chang et al.

(10) Patent No.: US 9,659,813 B1
(45) Date of Patent: May 23, 2017

(54) INTERCONNECTION AND MANUFACTURING METHOD THEREOF

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/072,277

(22) Filed: Mar. 16, 2016

Related U.S. Application Data

(60) Provisional application No. 62/291,530, filed on Feb. 5, 2016.

(51) Int. Cl.
| | | |
|---|---|---|
| H01L 21/768 | (2006.01) | |
| H01L 23/52 | (2006.01) | |
| H01L 23/532 | (2006.01) | |
| H01L 23/528 | (2006.01) | |
| H01L 23/522 | (2006.01) | |

(52) U.S. Cl.
CPC .... *H01L 21/76831* (2013.01); *H01L 21/7681* (2013.01); *H01L 21/76808* (2013.01); *H01L 21/76813* (2013.01); *H01L 21/76832* (2013.01); *H01L 23/5226* (2013.01); *H01L 23/5283* (2013.01); *H01L 23/53295* (2013.01)

(58) Field of Classification Search
CPC . H01L 2924/01078; H01L 2924/01079; H01L 2924/01029; H01L 23/5226; H01L 23/481; H01L 21/76; H01L 21/768; H01L 21/768; H01L 21/76808; H01L 21/76813; H01L 21/76831; H01L 21/76832
USPC .......................................................... 257/774
See application file for complete search history.

(56) References Cited

U.S. PATENT DOCUMENTS

| | | | | |
|---|---|---|---|---|
| 8,716,863 B2 * | 5/2014 | Wann | ................ | H01L 23/53276 257/478 |
| 2007/0018330 A1 * | 1/2007 | Takeda | .............. | H01L 21/76801 257/762 |
| 2009/0302480 A1 * | 12/2009 | Birner | ................ | H01L 21/76898 257/774 |

* cited by examiner

*Primary Examiner* — Monica D Harrison
(74) *Attorney, Agent, or Firm* — Jianq Chyun IP Office

(57) ABSTRACT

An interconnection includes first and second conductive layers, first and second dielectric layers, a stop layer, and first and second adhesion layers is provided. The first conductive layer is disposed over a semiconductor substrate. The first dielectric layer is over the first conductive layer, and the first dielectric layer includes a via hole. The second dielectric layer is disposed over the first dielectric layer. The stop layer is located between the first dielectric layer and the second dielectric layer, and the second dielectric layer and the stop layer include a trench. The second conductive layer is located in the via hole and the trench to electrically connect with the first conductive layer. The first adhesion layer is located on sidewalls of the trench. The second adhesion layer is located between the second conductive layer and the first adhesion layer and between the second conductive layer and the first dielectric layer.

20 Claims, 7 Drawing Sheets

INTERCONNECTION AND MANUFACTURING METHOD THEREOF

CROSS-REFERENCE TO RELATED APPLICATION

This application claims the priority benefit of U.S. provisional application Ser. No. 62/291,530, filed on Feb. 5, 2016. The entirety of the above-mentioned patent application is hereby incorporated by reference herein and made a part of this specification.

BACKGROUND

The semiconductor integrated circuit (IC) industry has experienced rapid growth. Over the course of this growth, functional density of the devices has generally increased by the device feature size.

In order to meet the requirements for smaller sizes and higher packing densities, electronic devices begin to incorporate a multilayer interconnection structure including interconnections and electrodes with inter-insulating layers disposed therebetween.

DETAILED DESCRIPTION

Figure 1:
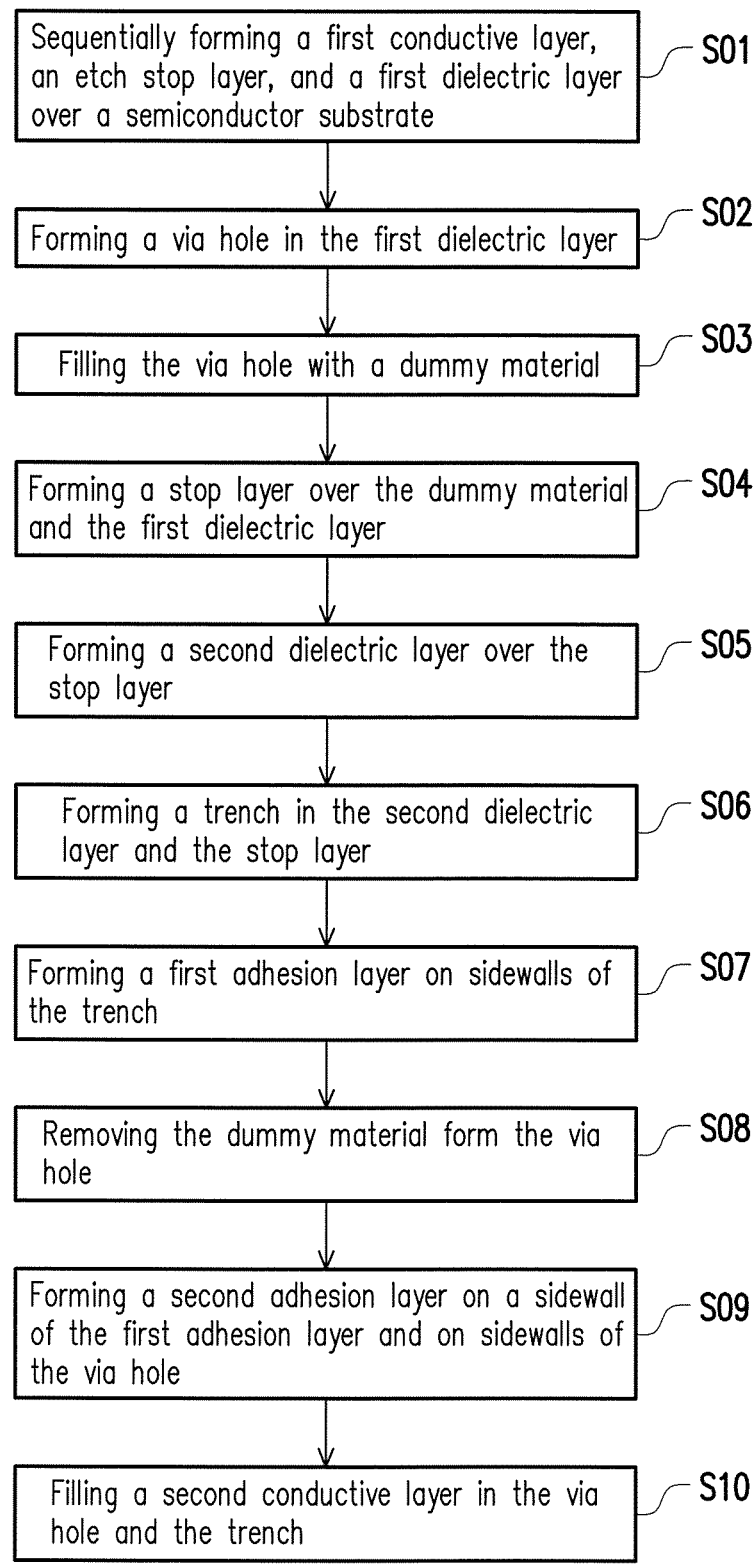
FIG. 1 is a flowchart illustrating a manufacturing method of an interconnection according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the figures. The spatially relative teams are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2A:
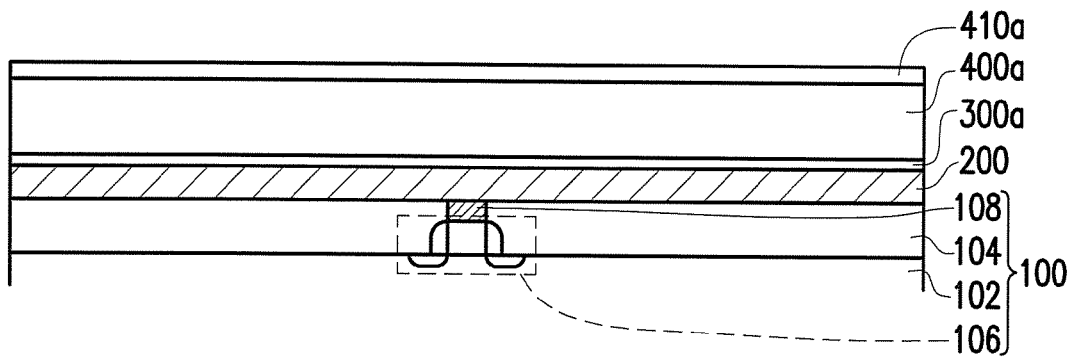
FIG. 2A through FIG. 2O are schematic cross-sectional views illustrating a manufacturing process of an interconnection according to some embodiments of the disclosure.

FIG. 1 is a flowchart illustrating a manufacturing method of an interconnection according to some embodiments of the disclosure. FIG. 2A through FIG. 2O are schematic cross-sectional views illustrating a manufacturing process of an interconnection according to some embodiments of the disclosure.

Referring to FIG. 1 and FIG. 2A, in step S01, a first conductive layer 200, an etch stop layer 300a, and a first dielectric layer 400 are formed over a semiconductor substrate 100 in sequential order. The semiconductor substrate 100 is a substrate as employed in a semiconductor integrated circuit fabrication, and integrated circuits may be formed therein and/or there upon. In some embodiments, the semiconductor substrate 100 is a silicon substrate with or without an epitaxial layer, a silicon-on-insulator substrate containing a buried insulator layer, or a substrate with a silicon germanium layer. In some embodiments, the semiconductor substrate 100 includes a substrate 102, a dielectric layer 104, an active device 106, and a contact 108. The active device 106 is disposed on the substrate 102. In some embodiments, the active device 106 includes a metal-oxide semiconductor (MOS) transistor. In some alternative embodiments, the active device 106 may include fin field effect transistors (FinFET). The dielectric layer 104 is disposed over the substrate 102 and covers the active device 106. In some embodiments, the dielectric layer 104 includes silicon oxide, silicon nitride, silicon oxynitride, or a low dielectric constant (low-k) material with a dielectric constant lower than 4, for example. A method of forming the dielectric layer includes, for example, spin-coating, CVD, a combination thereof, or the like. The first conductive layer 200 is disposed over the semiconductor substrate 100. The first conductive layer 200 includes copper, copper alloys, nickel, aluminum, manganese, magnesium, silver, gold, tungsten, a combination of thereof or the like, for example. Other suitable conductive materials may also be adapted for the first conductive layer 200. The first conductive layer 200 may be formed by, for example, electro-chemical plating process, CVD, Plasma-enhanced chemical vapor deposition (PECVD), atomic layer deposition (ALD), PVD, a combination thereof, or the like. It should be noted that in some embodiments, the dielectric layer 104 includes the contact 108 buried therein to render electrical connection between the first conductive layer 200 and the active device 106 of the semiconductor substrate 100. The contact 108 includes copper, copper alloys, nickel, aluminum, manganese, magnesium, silver, gold, tungsten, a combination of thereof or the like, for example. The contact 108 is formed by, for example, electro-chemical plating process, CVD, plasma-enhanced chemical vapor deposition (PECVD), atomic layer deposition (ALD), physical vapor deposition (PVD), a combination thereof, or the like.

The etch stop layer 300a is formed over the first conductive layer 200 to protect the first conductive layer 200 in the subsequent processes. The etch stop layer 300a includes, for example, silicon carbide, silicon nitride, SiCN, and SiOCN. In some embodiments, the etch stop layer 300a is formed by spin-coating, CVD, PVD, or ALD.

Subsequently, a first dielectric layer 400a is formed over the etch stop layer 300a. In some embodiments, a material of the first dielectric layer 400a is different from the material of the etch stop layer 300a. For example, the first dielectric layer 400a includes a low dielectric constant (low-k) material, a nitride such as silicon nitride, an oxide such as silicon oxide, undoped silicate glass (USG), phosphosilicate glass (PSG), borosilicate glass (BSG), boron-doped phosphosilicate glass (BPSG), or a combination thereof. Specifically, the low-k material has a dielectric constant of less than about 4 or even less than about 3. For example, the first dielectric layer 400a may have a k value of less than about 2.5, and hence is sometimes referred to as an extra low-k (ELK)

dielectric layer. In some embodiments, the low-k material includes a polymer based material, such as benzocyclobutene (BCB), FLARE®, or SILK®; or a silicon dioxide based material, such as hydrogen silsesquioxane (HSQ) or SiOF. In some alternative embodiments, the first dielectric layer 400a may be made of tetraethylorthosilicate (TEOS) materials. Furthermore, in some embodiments, the first dielectric layer 400a may include multiple dielectric materials. The formation method of the first dielectric layer 400a includes, for example, spin-coating, CVD, and ALD.

In some embodiments, a first hard mask layer 410a is further formed over the first dielectric layer 400a. The first hard mask layer 410a may be formed of metallic materials, such as Ti, TiN, Ta, TaN, Al, and the like. In some other embodiments adapting non-metal hard mask scheme, non-metallic materials such as $SiO_2$, SiC, SiN, and SiON may be used. The first hard mask layer 410a may be formed by, for example, electro-chemical plating process, CVD, plasma-enhanced chemical vapor deposition (PECVD), atomic layer deposition (ALD), PVD, a combination thereof, or the like. Further, in some alternative embodiments, an antireflection layer (not illustrated) is first formed on the first dielectric layer 400a. Subsequently, the first hard mask layer 410a is then formed on the antireflection layer. The antireflection layer may be referred to as a bottom anti-reflective coating (BARC). The antireflection layer is a nitrogen-free anti-reflective coating (NFARC) layer. In detail, the NFARC layer includes materials containing, for example, carbon and oxygen.

Figure 2B:
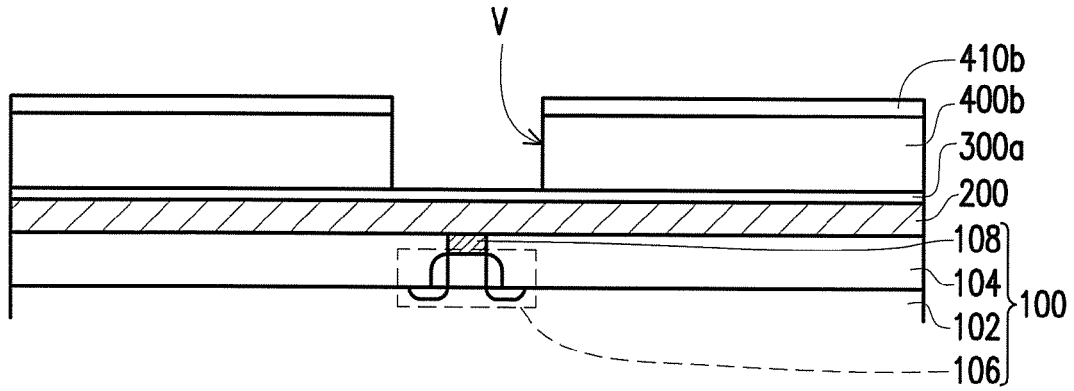

Referring to FIG. 1 and FIG. 2B, in step S02, a photo-lithographic and etching process is performed on the first hard mask layer 410a so that a patterned first hard mask layer 410b is formed. Subsequently, with the aid of the patterned first hard mask layer 410b as a mask, the first dielectric layer 400a is being etched to render a first dielectric layer 400b including a via hole V formed therein.

Figure 2C:
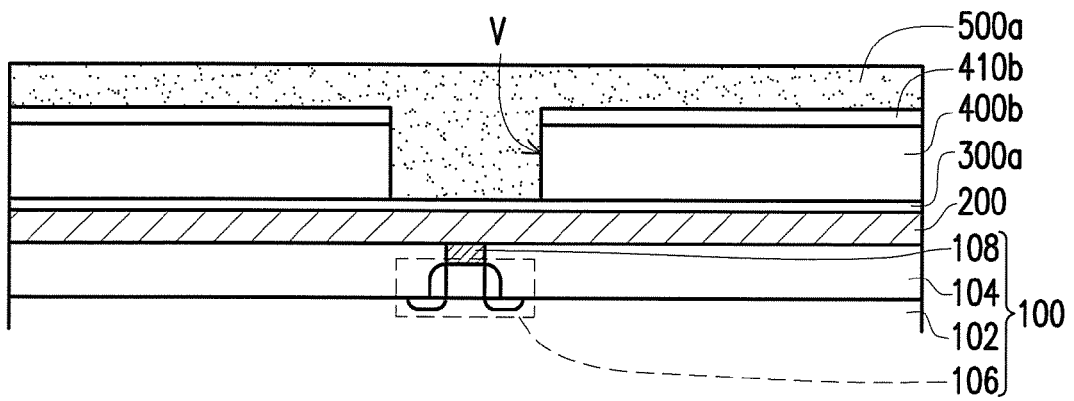
Figure 2D:
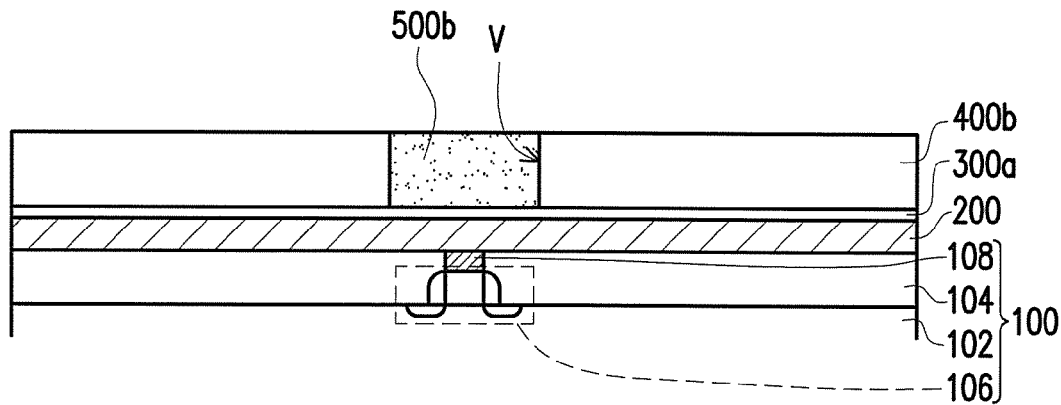

Referring to FIG. 1 and FIG. 2D, in step S03, a dummy material 500b is filled into the via hole V. In some embodiments, the dummy material 500b may include a plug substantially filling the via hole V. Alternatively, in some other embodiments, the dummy material 500b may include a liner located substantially over the bottom and sidewalls of the via hole V. In detail, as illustrated in FIG. 2C, dummy material 500a is disposed over the first hard mask layer 410a and is filled into the via hole V. The dummy material 500a may include one or more layers made of photoresist materials, polymer materials, or dielectric materials. In some embodiments, a material of the dummy material 500a and the material of the first dielectric layer 400b are different. For example, the dummy material 500a includes silicon, polysilicon, silicon dioxide (SiO2), tetraethylorthosilicate (TEOS) oxide, silicon nitride (SixNy; x and y are greater than 0), borophosphosilicate glass (BPSG), fluoride-doped silicate glass (FSG), low-k dielectric, and/or other suitable materials. The dummy material 500a may be formed, for example, by selective epitaxial growth (SEG), CVD, PECVD, ALD, PVD, electrophoresis, spin-on coating, or other suitable processes. Subsequent to the deposition of the dummy material 500a, part of the dummy material 500a and the first hard mask layer 410b are removed so as to render the dummy material 500b located solely in the via hole V, as illustrated in FIG. 2D. The method for removing the excessive dummy material includes, for example, etching, chemical mechanical polishing (CMP), or other suitable polishing methods.

Figure 2E:
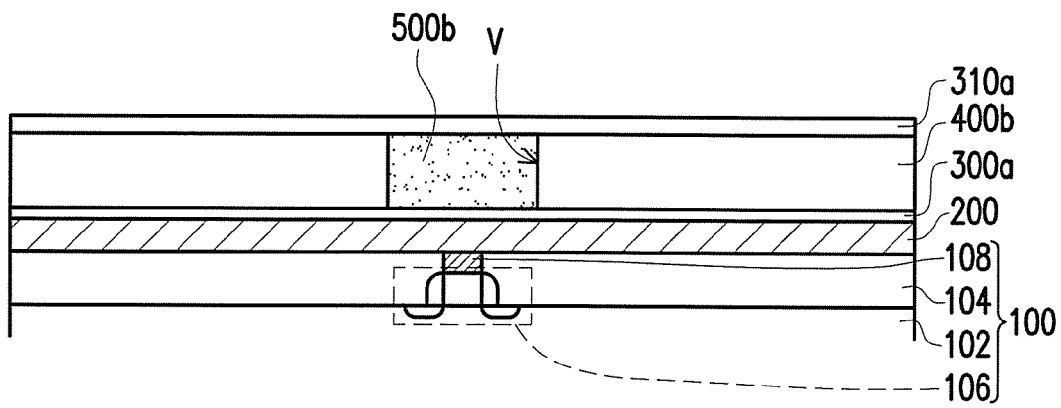

Referring to FIG. 1 and FIG. 2E, in step S04, a stop layer 310a is formed over the dummy material 500b and the first dielectric layer 400b. A material of the stop layer 310a may be the same as or different from the material of the etch stop layer 300a. For example, the stop layer 310a includes silicon carbide, silicon nitride, SiCN, SiOCN, and other suitable material in some embodiments. In some embodiments, the stop layer 310a may be formed by spin-coating, CVD, PVD, or ALD. Similar to that of the etch stop layer 300a, the stop layer 310a may also serve the function of protecting the first dielectric layer 400b and the dummy material 500b from the subsequent processes.

Figure 2F:
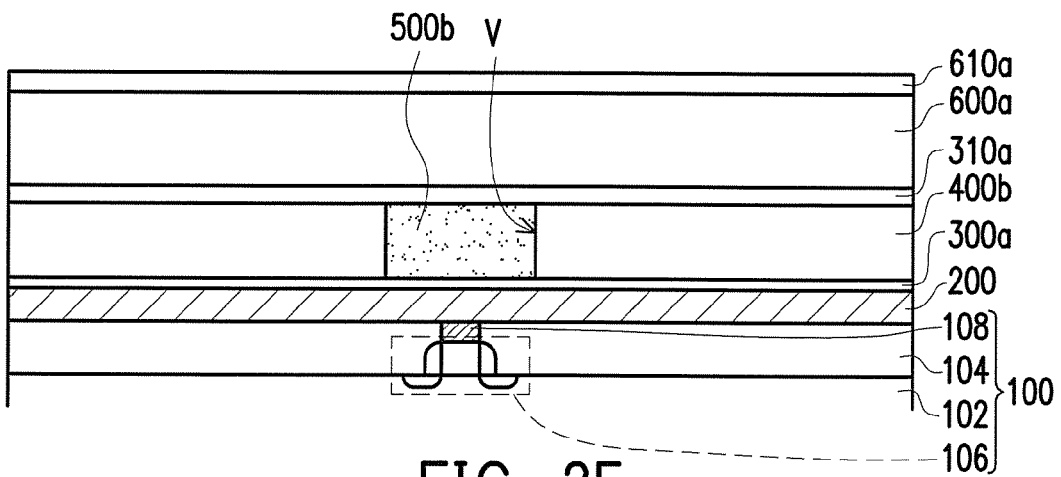

Referring to FIG. 1 and FIG. 2F, in step S05, in some embodiments, a second dielectric layer 600a is formed over the stop layer 310a. A material of the second dielectric layer 600a is identical as the material of the first dielectric layer 400b. In alternative embodiments, the material of the second dielectric layer 600a is different from the material of the first dielectric layer 400b and is different from the material of the stop layer 310a. Therefore, in some embodiments, the second dielectric layer 600a includes a low dielectric constant (low-k) material, an extra low-k (ELK) material, a nitride such as silicon nitride, an oxide such as silicon oxide, undoped silicate glass (USG), phosphosilicate glass (PSG), borosilicate glass (BSG), boron-doped phosphosilicate glass (BPSG), tetraethylorthosilicate (TEOS), or a combination thereof. Similar to that of the first dielectric layer 400b, the second dielectric layer 600a may also include multiple dielectric materials. The formation method of the second dielectric layer 600a includes, for example, spin-coating, CVD, PVD, and ALD.

In some alternative embodiments, a second mask layer 610a is further formed over the second dielectric layer 600a. The second mask layer 610a may adapt the same material or different material as compared to the first hard mask layer 410a. For example, in some embodiments, the second hard mask layer 610a may be formed of metallic materials, such as Ti, TiN, Ta, TaN, Al, and the like. In some other embodiments adapting non-metal hard mask scheme, non-metallic materials such as $SiO_2$, SiC, SiN, and SiON may be used. The second hard mask layer 610a may be formed by, for example, electro-chemical plating process, CVD, plasma-enhanced chemical vapor deposition (PECVD), atomic layer deposition (ALD), PVD, a combination thereof, or the like. Further, in some alternative embodiments, an antireflection layer is first formed on the second dielectric layer 600a. Subsequently, the second hard mask layer 610a is then forming on the antireflection layer. The antireflection layer may be referred to as a bottom anti-reflective coating (BARC). The antireflection layer is a nitrogen-free anti-reflective coating (NFARC) layer. In detail, the NFARC layer includes materials containing, for example, carbon and oxygen.

Figure 2G:
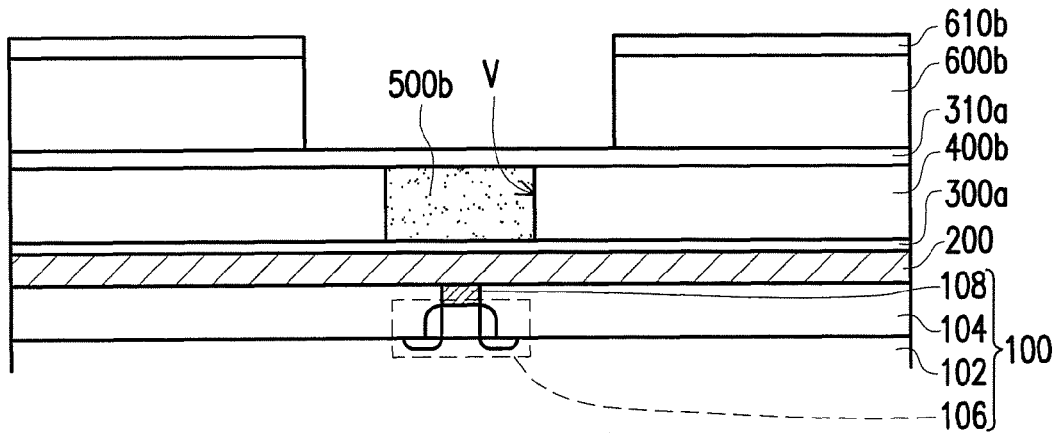
Figure 2H:
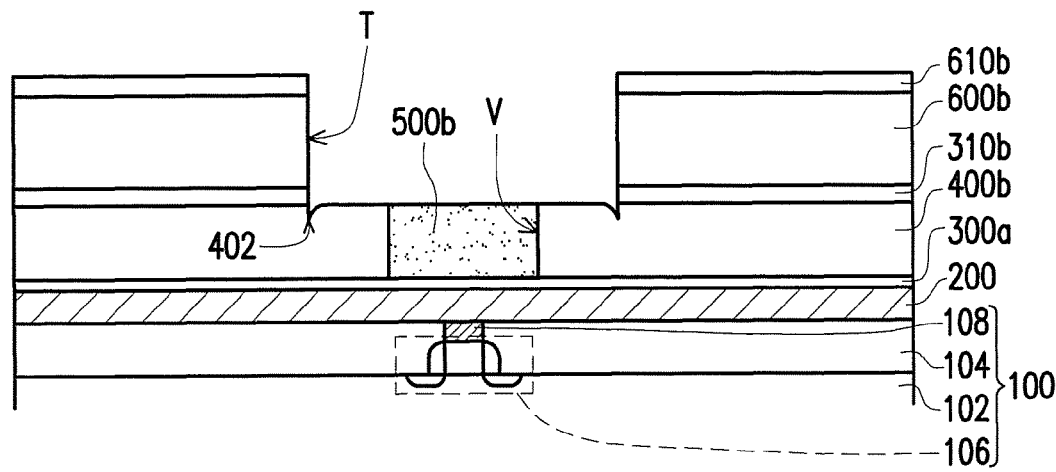

Referring to FIG. 1 and FIG. 2G, in step S06, a photo-lithographic and etching process is performed to form a patterned second hard mask layer 610b. Subsequently, with the aid of the patterned second hard mask layer 610b as a mask and the stop layer 310a as an etching stop layer, the second dielectric layer 600a is being etched to render a second dielectric layer 600b. Referring to FIG. 2H, subsequently, the stop layer 310a exposed by the second dielectric layer 600b is etched to complete the formation of a trench T. In some embodiments, the trench T exposes part of the first dielectric layer 400b and the dummy material 500b. Depending on the materials of the second dielectric layer 600a and the stop layer 310a, the etching of the second dielectric layer 600a and the stop layer 310a may be conducted by a same etchant or different etchants. That is, the etching of the second dielectric layer 600a and the stop layer 310a (as illustrated in FIG. 2G and FIG. 2H) may be performed by a single process or multiple processes. Since the stop layer 310a is a thin layer while a high etching selectivity ratio of the stop layer 310a to the second dielectric layer 600b can be achieved by the selection of the etchant, the trench T has a planar bottom surface. In some embodiments, the trench T has a planar bottom surface and only a small tiger teeth-like recess 402 is formed on the sidewalls of the trench T which extends into a portion of the first dielectric layer 400b, as illustrated in FIG. 2H.

Figure 2I:
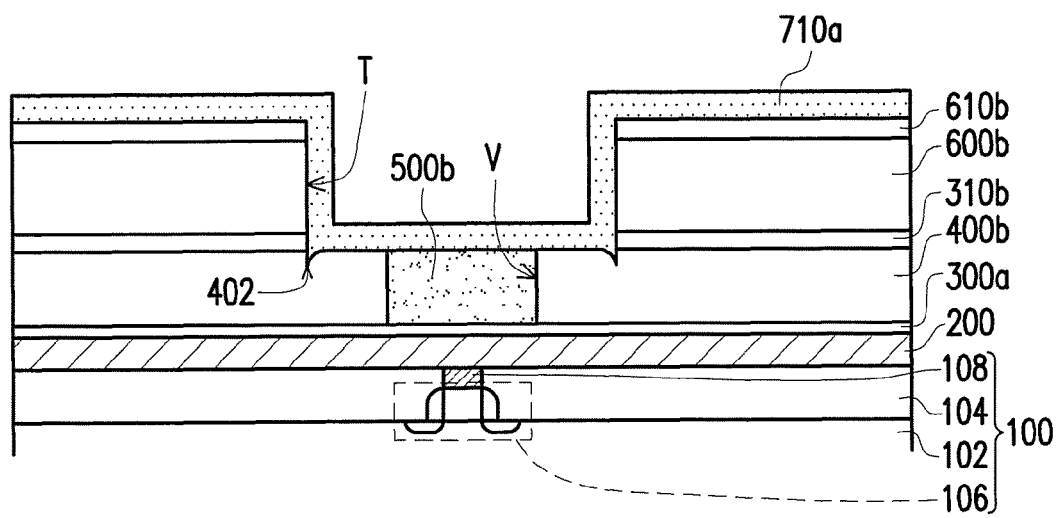
Figure 2J:
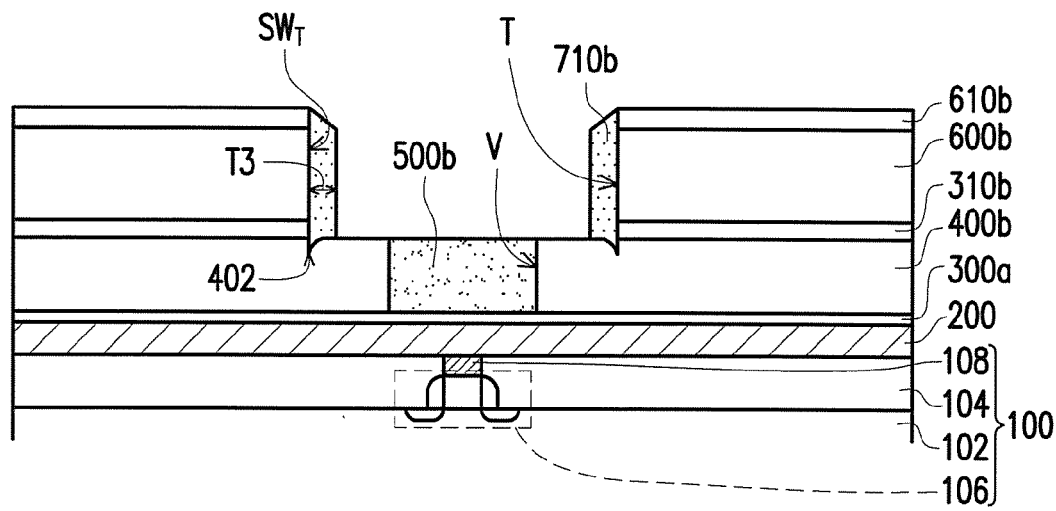

Referring to FIG. 1, FIG. 2J, in step S07, a first adhesion layer 710b is formed on sidewalls $SW_T$ of the trench T. In some embodiments, the first adhesion material layer 710a is not only formed on the sidewalls $SW_T$ of the trench T but also filled in the small tiger teeth-like recess 402. In other words, a thickness T3 of the first adhesion material layer 710b may be greater than a width of the small tiger teeth-like recess 402. Specifically, referring to FIG. 2I, a first adhesion material layer 710a is formed over the second hard mask layer 610b, in the trench T, and in the small tiger teeth-like recess 402. In some embodiments, a material of the first adhesion material layer 710a is different from the material of the first dielectric layer 400b and is different from the material of the second dielectric layer 600b. On the other hand, in some embodiments, the material of the first adhesion material layer 710a is the same as the material of the stop layer 310b. In some alternative embodiments, the material of the first adhesion material layer 710a is different from the material of the stop layer 310b. Specifically, in some embodiments, the material of the first adhesion material layer 710a includes insulating materials. For example, the insulating materials for the first adhesion material layer 710a include, SiN, SiON, SiCON, other suitable materials, or combinations thereof. The method for forming the first adhesion material layer 710a includes CVD, PVD, and ALD, for example. Referring to FIG. 2I and FIG. 2J, the first adhesion material layer 710a is etched by an anisotropic etching process to expose the dummy material 500b and the first dielectric layer 400b, so as to render the first adhesion layer 710b located on sidewalls $SW_T$ of the trench T.

Figure 2K:
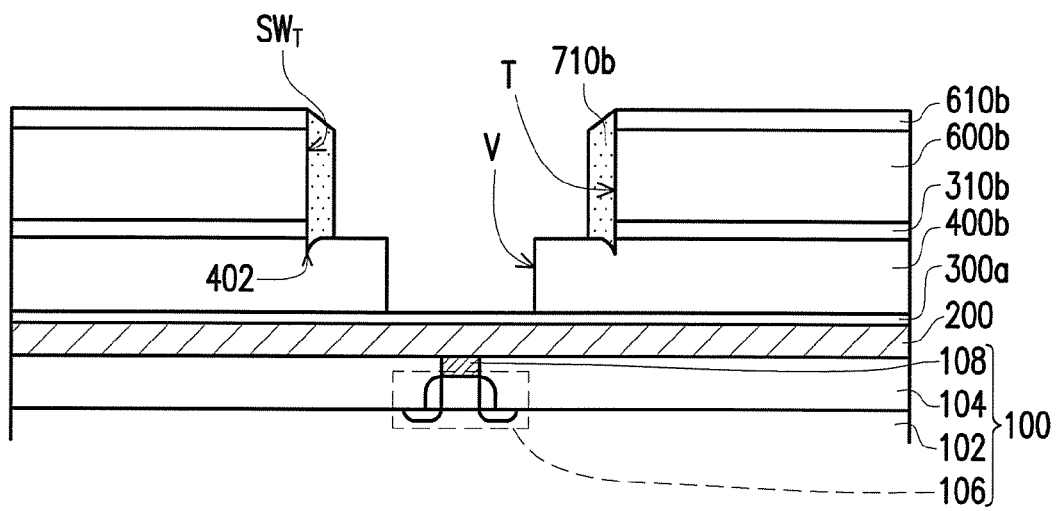

Referring to FIG. 1 and FIG. 2K, in step S08, the dummy material 500b is removed from the via hole V. The dummy material 500b may be removed by plasma etch, chemical etch, thermal burn-out, and/or other suitable processes. For example, the dummy material 500b may be removed by an oxygen-containing plasma environment. The dummy material 500b may also be removed by a plasma environment which may include reactant gases such as hydrochloric acid (HCl), hydrogen bromide (HBr), sulfur dioxide ($SO_2$), chlorine ($Cl_2$), sulfur hexafluoride ($SF_6$), perfluorocarbons, and/or other reactants. Alternatively, the dummy material 500b may be removed by chemical etch which may include phosphoric acid ($H_3PO_4$), ammonium hydroxide ($NH_4OH$), hydrochloric acid (HCl), hydrofluoric acid (HF), sulfuric acid ($H_2SO_4$), hydrogen peroxide ($H_2O_2$), de-ionized water, and/or other chemicals. As illustrated in FIG. 2K, the trench T constitute a larger opening as compared to the via hole V. Alternatively speaking, a width of the trench T is larger than a width of the via hole V.

Figure 2L:
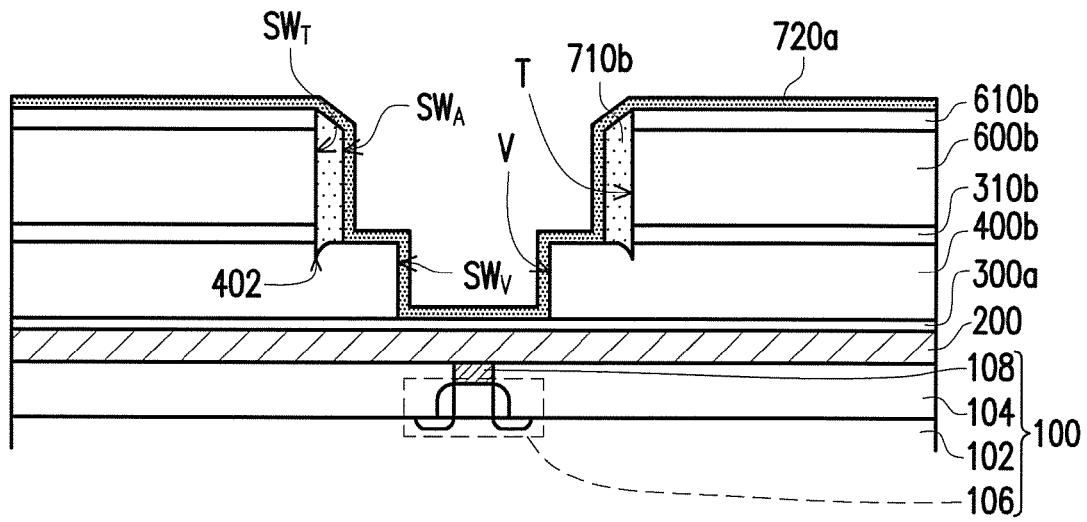
Figure 2M:
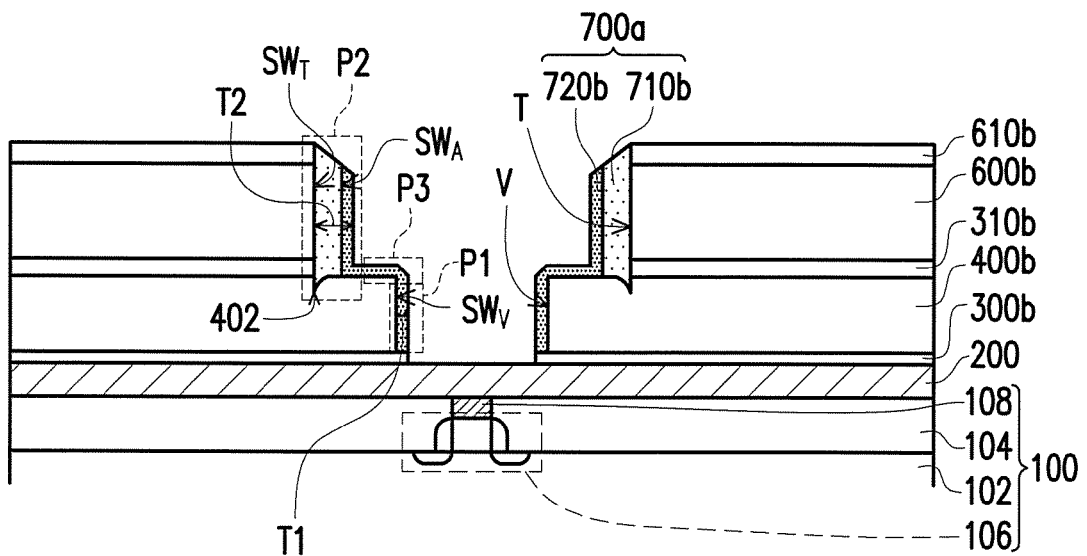

Referring to FIG. 1 and FIG. 2M, in step S09, a second adhesion layer 720b is formed on a sidewall $SW_A$ of the first adhesion layer 710b and on sidewalls $SW_V$ of the via hole V. Specifically, referring to FIG. 2L, a second adhesion material layer 720a is formed over the second hard mask layer 610 and in the trench T and the via hole V. A material of the second adhesion material layer 720a is the same as or different from the material of the first dielectric layer 400b.

Similarly, the material of the second adhesion material layer 720a is the same as or different from the material of the second dielectric layer 600b. On the other hand, in some embodiments, the material of the second adhesion material layer 720a is the same as the material of the stop layer 310b. In some alternative embodiments, the material of the second adhesion material layer 720a is different from the material of the stop layer 310b. Similar to the first adhesion material layer 710b, the second adhesion material layer 720a also includes insulating materials. In some embodiments, the second adhesion material layer 720a includes SiN, SiON, SiCON, other suitable materials, or combinations thereof. The method for forming the second adhesion material layer 710a includes CVD, PVD, and ALD, for example. In some embodiments, the second adhesion material layer 720a is formed by ALD so as to provide a good via critical dimension control. As such, the via and trench process window may be enlarged while the electrical property of the semiconductor device may be enhanced.

Referring to FIG. 2M, the second adhesion material layer 720a is patterned or etched by an anisotropic etching process, so as to form second adhesion layer 720b on a sidewall $SW_A$ of the first adhesion layer 710b and on sidewalls $SW_V$ of the via hole V. Subsequent to the formation of the second adhesion layer 720b, the etch stop layer 300a exposed by the via hole V is removed to render etch stop layer 300b. The etch stop layer 300b exposes the first conductive layer 200 for electrical connection in the subsequent processes. It should be noted that the materials of the first adhesion layer 710b and the second adhesion layer 720b may be the same or different. In some embodiments, the first adhesion layer 710b and the second adhesion layer 720b constitute an insulation layer 700a. The insulation layer 700a may be single or multi-layered. For example, in a case where the materials of the first adhesion layer 710b and the second adhesion layer 720b are the same, the insulation layer 700a is a single-layered structure. Alternatively, in some alternative embodiments where the materials of the first adhesion layer 710b and the second adhesion layer 720b are different, these two layers constitute the insulation layer 700a which has a multi-layered structure. On the other hand, In some alternative embodiments, the insulation layer 700a includes a first portion P1, a second portion P2, and a third portion P3. In some alternative embodiments, the insulation layer 700a includes the first portion P1 and the second portion P2 without the third portion P3. The first portion P1 of the insulation layer 700a is located on the sidewall $SW_V$ of the via hole V, and the second portion P2 of the insulation layer 700a is located on the sidewall $SW_T$ of the trench T. The third portion P3 of the insulation layer 700a is located over the first dielectric layer and extends in a horizontal direction. Moreover, the third portion P3 connects the first portion P1 and the second portion P2. As illustrated in FIG. 2M, the second portion P2 of the insulation layer 700a includes the first adhesion layer 710b and the second adhesion layer 720b while the first portion P1 and the third portion P3 respectively include the second adhesion layer 720b. In other words, in some embodiments, a thickness T2 of the second portion P2 is greater than a thickness Ti of the first portion P1. Similarly, the thickness T2 of the second portion P2 is also greater than the width of the small tiger teeth-like recess 402.

Referring to FIG. 1 and FIG. 2O, in step S10, a second conductive layer 800b is filled into the trench T and the via hole V to electrically connect with the first conductive layer 200 and to render an interconnection 10. In some embodiments, since the thickness T2 of the second portion P2 of the insulation layer 700a is greater than the width of the small tiger teeth-like recess 402, the second conductive layer 800b is not filled into the small tiger teeth-like recess 402.

Figure 2N:
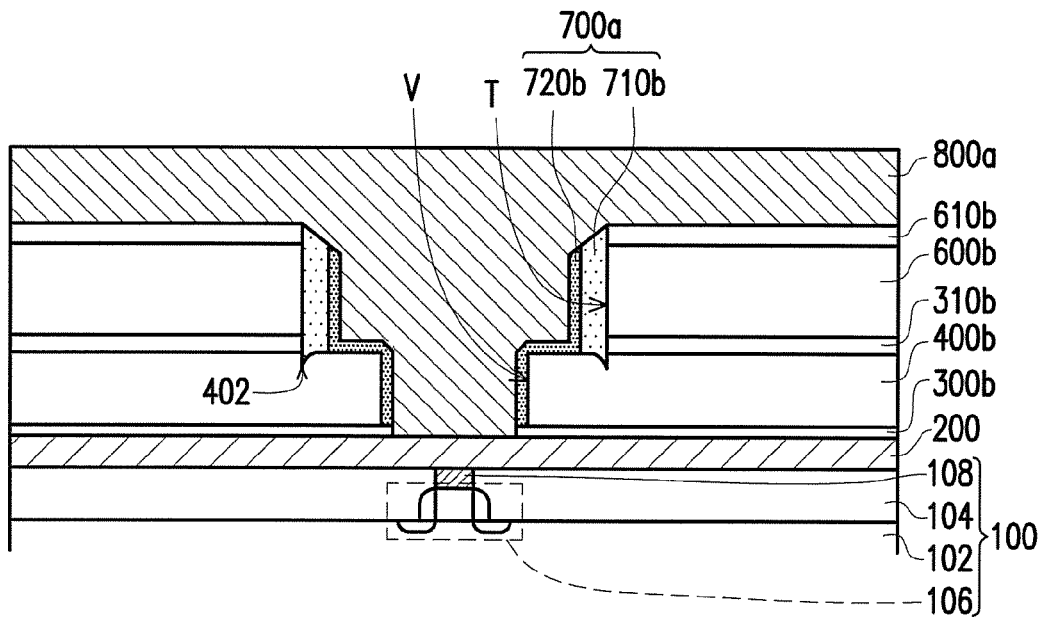
Figure 2O:
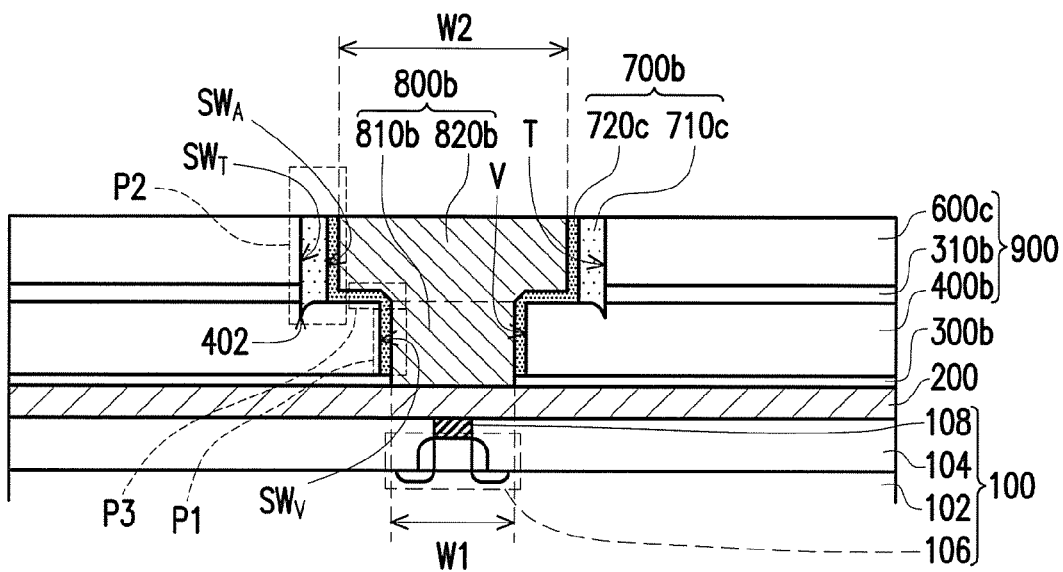

Referring to FIG. 2N, in detail, a second conductive material 800a is formed over the second hard mask layer 610b and is filled into the trench T and the via hole V. A material of the second conductive material 800a may be the same as or different from the material of the first conductive layer 200. For example, the second conductive material 800a may include, copper, copper alloys, nickel, aluminum, manganese, magnesium, silver, gold, tungsten, a combination of thereof or the like. Similar to that of the first conductive layer 200, the second conductive material 800a may be formed by, for example, electro-chemical plating process, CVD, PECVD, ALD, PVD, a combination thereof, or the like. Referring to FIG. 2N and FIG. 2O, a portion of the second conductive material 800a, the second hard mask layer 610b, a portion of the insulation layer 700a, and a portion of the second dielectric layer 600b are removed to form the second conductive layer 800b located in the trench T and the via hole V, a insulation layer 700b and a second dielectric layer 600c. The removing process may be achieved by chemical etching, CMP, or other suitable processes. In some embodiments, a barrier layer or a glue layer (not illustrated) may be formed between the second conductive layer 800b and the insulation layer 700b to prevent the migration of the material of the second conductive layer 800b to the insulation layer 700b, the first dielectric layer 400b, and the second dielectric layer 600c. In some embodiments, a material of the barrier layer includes tantalum, tantalum nitride, titanium, titanium nitride, cobalt-tungsten (CoW) or a combination thereof. Other materials listed above may be used for the barrier layer or the glue layer depending on the material of the second conductive layer 800b. Referring to FIG. 2O, after the removing process is completed, the insulation layer 700b includes a first adhesion layer 710c and a second adhesion layer 720c. The first adhesion layer 710c is located on sidewalls $SW_T$ of the trench T. The second adhesion layer 720c is located between the second conductive layer 800b and the first adhesion layer 710c and between the second conductive layer 800b and the first dielectric layer 400b.

In some embodiments, the second conductive layer 800b may be divided into a first conductive portion 810b and a second conductive portion 820b. The first conductive portion 810b is located in the via hole V and the second conductive portion 820b is located in the trench T. As mentioned above, a width of the trench T is greater than a width of the via hole V, and thus a width W2 of the second conductive portion 820b is greater than a width W1 of the first conductive portion 810b. In some embodiments, the first conductive portion 810b constitute a via and the second conductive portion 820b constitute a conductive line. For example, the via extends along a vertical direction while the conductive line extends along a horizontal direction.

Alternatively, in some embodiments, the first dielectric layer 400b and the second dielectric layer 600c may be viewed as a single dielectric layer 900. In other words, the stop layer 310b is buried in the dielectric layer 900, and the second conductive layer 800b penetrates through the dielectric layer 900. Moreover, as mentioned above, the first adhesion layer 710c and the second adhesion layer 720c constitute the insulation layer 700b in some embodiments. Referring to FIG. 2O, the first portion P1 of the insulation layer 700b is located between a portion of the dielectric layer 900 and the first conductive portion 810b of the second conductive layer 800b. On the other hand, the second portion P2 of the insulation layer 700b is located between another portion of the dielectric layer 900, the stop layer 310b, and the second conductive portion 820b of the second conductive layer 800b. Moreover, the third portion P3 of the insulation layer 700b is located under the second conductive portion (conductive line) 820b and connects the first portion P1 of the insulation layer 700b and the second portion P2 of the insulation layer 700b.

Referring to FIG. 1 and FIG. 2O, in the present disclosure, since the via hole V is formed first and the trench T is then formed, by adapting the stop layer 310a with a small thickness (a thin layer) and a specific selection of the etchant (a high etching selectivity ratio of the stop layer 310a to the first dielectric layer 400b), the loading effect of the device may be reduced. Moreover, as mentioned above, in the interconnection 10, the trench T has a substantially planar bottom surface. Even though the small tiger teeth-like recess 402 are located on sidewalls $SW_T$ of the trench T, the size thereof is small enough to be neglected. As a matter of fact, since the insulation layer 700b is filled into the tiger teeth-like recess 402, the electrical property of the second conductive layer 800b filled in the trench T and the via hole V in the subsequent process would not be compromised. Further, since an insulation layer 700b is formed after the formation of the via hole V and the trench T, the process window for the via hole V and the trench T may be enlarged. Consequently, the tuning of the device may be easily achieved, the electrical property of the semiconductor device may be improved, and the yield of the semiconductor device may be enhanced.

The present disclosure is not limited to applications in which the semiconductor device includes MOSFETs or FinFETs, and may be extended to other integrated circuit having a dynamic random access memory (DRAM) cell, a single electron transistor (SET), and/or other microelectronic devices (collectively referred to herein as microelectronic devices).

In accordance with some embodiments of the present disclosure, an interconnection includes a first conductive layer, a first dielectric layer, a second dielectric layer, a stop layer, a second conductive layer, a first adhesion layer, and a second adhesion layer. The first conductive layer is disposed over a semiconductor substrate. The first dielectric layer is disposed over the first conductive layer, and the first dielectric layer includes a via hole. The second dielectric layer is disposed over the first dielectric layer. The stop layer is located between the first dielectric layer and the second dielectric layer, and the second dielectric layer and the stop layer include a trench. The second conductive layer is located in the via hole and the trench to electrically connect with the first conductive layer. The first adhesion layer is located on sidewalls of the trench. The second adhesion layer is located between the second conductive layer and the first adhesion layer and between the second conductive layer and the first dielectric layer.

In accordance with alternative embodiments of the present disclosure, an interconnection includes a first conductive layer, a dielectric layer, a second conductive layer, and an insulation layer. The first conductive layer is disposed over a semiconductor substrate. The dielectric layer is disposed over the first conductive layer. The second conductive layer penetrates through the dielectric layer to electrically connect with the first conductive layer. The insulation layer is located between the dielectric layer and the second conductive layer, and a material of the insulation layer and a material of the dielectric layer are different.

In accordance with yet alternative embodiments of the present disclosure, a manufacture method of an interconnection is as below. A first conductive layer and a first dielectric layer are sequentially formed over a semiconductor substrate. A via hole is formed in the first dielectric layer. A dummy material is filled into the via hole. A stop layer and a second dielectric layer are sequentially formed over the first dielectric layer and the dummy material. A trench is formed in the second dielectric layer and the stop layer. A dummy material is removed from the via hole. At least one adhesion layer is formed on sidewalls of the via hole and sidewalls of the trench. A second conductive layer is filled in the via hole and the trench to electrically connect with the first conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnection, comprising:
    a first conductive layer disposed over a semiconductor substrate;
    a first dielectric layer over the first conductive layer, wherein the first dielectric layer comprises a via hole;
    a second dielectric layer over the first dielectric layer;
    a stop layer located between the first dielectric layer and the second dielectric layer, wherein the second dielectric layer and the stop layer comprise a trench;
    a second conductive layer located in the via hole and the trench to electrically connect with the first conductive layer, wherein the second conductive layer comprises an upper portion located in the trench and a bottom portion located in the via hole;
    a first adhesion layer located on sidewalls of the trench; and
    a second adhesion layer located between the upper portion of the second conductive layer and the first adhesion layer and between the lower portion of the second conductive layer and the first dielectric layer.

2. The interconnection according to claim 1, wherein a material of the first adhesion layer and the second adhesion layer and a material of the stop layer are the same.

3. The interconnection according to claim 1, wherein a material of the first adhesion layer and a material of the stop layer are different, and a material of the second adhesion layer and the material of the stop layer are different.

4. The interconnection according to claim 1, wherein a material of the first adhesion layer and a material of the second adhesion layer comprise an insulating material.

5. The interconnection according to claim 4, wherein the insulating material is different from a material of the first dielectric layer and different from a material of the second dielectric layer.

6. The interconnection according to claim 1, wherein a material of each of the first adhesion layer and the second adhesion layer comprises SiN, SiON, SiCON, or combinations thereof.

7. An interconnection, comprising:
    a first conductive layer disposed over a semiconductor substrate;
    a dielectric layer over the first conductive layer, wherein the dielectric layer comprises an opening;
    a second conductive layer through the opening of the dielectric layer to electrically connect with the first conductive layer; and
    an insulation layer located between the dielectric layer and the second conductive layer, wherein a material of the insulation layer and a material of the dielectric layer are different, and the insulation layer is disposed on sidewalls of the opening.

8. The interconnection according to claim 7, further comprising a stop layer buried in the dielectric layer.

9. The interconnection according to claim 8, wherein a first portion of the insulation layer is located between the dielectric layer and a first conductive portion of the second conductive layer, and a second portion of the insulation layer is located between the dielectric layer, the stop layer, and a second conductive portion of the second conductive layer.

10. The interconnection according to claim 9, wherein a width of the second conductive portion is greater than a width of the first conductive portion, and a thickness of the second portion of the insulation layer is greater than a thickness of the first portion of the insulation layer.

11. The interconnection according to claim 10, wherein the first conductive portion comprises a via, and the second conductive portion comprises a conductive line.

12. The interconnection according to claim 11, wherein a third portion of the insulation layer is located under the conductive line and connects the first portion of the insulation layer and the second portion of the insulation layer.

13. The interconnection according to claim 7, wherein a material of the insulation layer comprises SiN, SiON, SiCON, or combinations thereof.

14. A method for manufacturing an interconnection, comprising:
    sequentially forming a first conductive layer and a first dielectric layer over a semiconductor substrate;
    forming a via hole in the first dielectric layer;
    filling a dummy material into the via hole;
    sequentially forming a stop layer and a second dielectric layer over the first dielectric layer and the dummy material;
    forming a trench in the second dielectric layer and the stop layer;
    removing the dummy material from the via hole;
    forming at least one adhesion layer on sidewalls of the via hole and sidewalls of the trench; and
    filling a second conductive layer in the via hole and the trench to electrically connect with the first conductive layer.

15. The method for manufacturing an interconnection according to claim 14, wherein a material of the at least one adhesion layer comprises SiN, SiON, SiCON, or combinations thereof.

16. The method for manufacturing an interconnection according to claim 14, wherein a material of the dummy material and a material of the first dielectric layer are different.

17. The method for manufacturing an interconnection according to claim 14, wherein the step of forming the at least one adhesion layer comprises:
    forming a first adhesion layer on the sidewalls of the trench; and forming a second adhesion layer on a sidewall of the first adhesion layer and sidewalls of the via hole.

18. The method for manufacturing an interconnection according to claim 17, wherein the step of forming the first adhesion layer is performed before the step of removing the dummy material from the via hole.

19. The method for manufacturing an interconnection according to claim 14, wherein the step of forming the trench in the second dielectric layer and the stop layer comprises:

patterning the second dielectric layer; and removing the stop layer exposed by the patterned second dielectric layer to form the trench.

20. The method for manufacturing an interconnection according to claim 14, further comprising:

forming an etch stop layer on the semiconductor substrate before forming the first dielectric layer; and removing the etch stop layer exposed by the via hole before the step of filling the second conductive layer.

* * * * *